United States Patent
Matsuoka (10) Patent No.: US 10,013,021 B2
(45) Date of Patent: Jul. 3, 2018

(54) HINGE FOR A MULTIPLE OPERATING MODE COMPUTING DEVICE

(71) Applicant: Google Inc., Mountain View, CA (US)

(72) Inventor: Yoshimichi Matsuoka, Cupertino, CA (US)

(73) Assignee: Google LLC, Mountain View, CA (US)

( * ) Notice: Subject to any disclaimer, the term of this patent is extended or adjusted under 35 U.S.C. 154(b) by 17 days.

(21) Appl. No.: 15/163,836

(22) Filed: May 25, 2016

(65) Prior Publication Data

US 2016/0266608 A1   Sep. 15, 2016

Related U.S. Application Data

(63) Continuation of application No. 14/145,377, filed on Dec. 31, 2013, now Pat. No. 9,383,778.

(51) Int. Cl.
| | |
|---|---|
| *G06F 1/16* | (2006.01) |
| *H05K 5/00* | (2006.01) |
| *H05K 7/00* | (2006.01) |
| *B21D 53/40* | (2006.01) |
| *E05D 3/06* | (2006.01) |

(Continued)

(52) U.S. Cl.
CPC ........... *G06F 1/1616* (2013.01); *B21D 53/40* (2013.01); *E05D 3/06* (2013.01); *E05D 3/12* (2013.01); *E05D 11/1028* (2013.01); *G06F 1/1618* (2013.01); *G06F 1/1681* (2013.01); *H05K 5/0226* (2013.01); *E05D 2011/1092* (2013.01); *E05Y 2900/606* (2013.01); *Y10T 16/52* (2015.01); *Y10T 29/24* (2015.01)

(58) Field of Classification Search
CPC .... G06F 1/1616; G06F 1/1618; G06F 1/1681; E05D 3/06; E05D 3/12

USPC ............ 361/679.26, 679.28, 679.55
See application file for complete search history.

(56) References Cited

U.S. PATENT DOCUMENTS 5,548,478 A * 8/1996 Kumar ................. G06F 1/162
                                                  16/223
5,781,409 A    7/1998 Mecredy, III
(Continued)

FOREIGN PATENT DOCUMENTS

| CN | 1677311 A | 10/2005 |
|---|---|---|
| CN | 2754312 Y | 1/2006 |

(Continued)

OTHER PUBLICATIONS

Office Action for CN Application No. 201410849990.6, dated Mar. 29, 2017, 16 Pages.

(Continued)

*Primary Examiner* — Anthony Haughton
(74) *Attorney, Agent, or Firm* — Brake Hughes Bellerman LLP (57) ABSTRACT

In one general aspect, a computing device can include a lid, and a base coupled to the lid by a hinge. The hinge can include a first disc including a first pin coupled to the lid and an inner surface. The hinge can include a second disc including a second pin coupled to the base and an outer surface. The first disc can be concentric with and can partially surround the second disc. The hinge can further include a friction element disposed between the inner surface of the first disc and the outer surface of the second disc. The first disc can be configured to rotate about the second disc.

20 Claims, 9 Drawing Sheets

(51) Int. Cl.
   *H05K 5/02*   (2006.01)
   *E05D 3/12*   (2006.01)
   *E05D 11/10*  (2006.01)

(56) References Cited

U.S. PATENT DOCUMENTS

| | | | |
|---|---|---|---|
| 5,898,600 | A * | 4/1999 | Isashi ............... G06F 1/1618 345/169 |
| 5,987,704 | A | 11/1999 | Tang |
| 6,249,426 | B1 | 6/2001 | O'Neal |
| 6,493,216 | B1 | 12/2002 | Lin |
| 7,155,266 | B2 | 12/2006 | Stefansen |
| 7,345,872 | B2 | 3/2008 | Wang |
| 7,373,692 | B2 | 5/2008 | Kfoury |
| 7,791,876 | B2 | 9/2010 | Moore |
| 8,302,260 | B2 | 11/2012 | Chen |
| 9,383,778 | B2 | 7/2016 | Matsuoka et al. |
| 2004/0155861 | A1 | 8/2004 | Jackson, III |
| 2005/0052834 | A1 | 3/2005 | Tanaka |
| 2009/0244009 | A1 | 10/2009 | Staats |
| 2010/0034575 | A1 | 2/2010 | Colman |
| 2012/0106060 | A1 | 5/2012 | Probst |
| 2013/0239367 | A1 | 9/2013 | Chung et al. |
| 2014/0285960 | A1 * | 9/2014 | Sharma ............... G06F 1/1654 361/679.28 |
| 2015/0185788 | A1 | 7/2015 | Matsuoka |

FOREIGN PATENT DOCUMENTS

| | | |
|---|---|---|
| CN | 101382823 A | 3/2009 |
| CN | 101729615 A | 6/2010 |
| DE | 8327996 U1 | 1/1984 |
| EP | 2202949 A1 | 6/2010 |
| EP | 1698156 B1 | 5/2011 |
| WO | 2014084881 A2 | 6/2014 |
| WO | 2014088617 A2 | 6/2014 |
| WO | 2014160620 A1 | 10/2014 |

OTHER PUBLICATIONS

"Aspire S7", Acer, retrieved on Dec. 2, 2013 from us.acer.com/ac/en/US/content/series/aspires7, 2 pages.
"HP EliteBook Revolve", HP, Specification, Feb. 2013, 4 pages.
"IdeaPad Yoga 11S: Mini Laptop", Lenovo, retrieved on Oct. 17, 2013 from http://shop.lenovo.com/us/en/laptops/ideapad/yoga/yoga-11s/, 4 pages.
"Lenovo Flex 14 Laptop", Lenovo, retrieved on Oct. 17, 2013 from http://shop.lenovo.com/us/en/laptops/ideapad/flex/flex-141, 3 pages.
Non-Final Office Action for U.S. Appl. No. 14/145,377, dated Oct. 8, 2015, 16 pages.
Notice of Allowance for U.S. Appl. No. 14/145,377, dated Feb. 29, 2016, 8 pages.
Office Action for CN Application No. 201410849990.6 (with English translation), dated Aug. 31, 2016, 19 Pages.
Decision of Rejection for CN Application No. 201410849990.6, dated Aug. 31, 2017, 16 pages.
Office Action for DE Application No. DE 102014019622.4, dated Jun. 6, 2017, 14 pages.

* cited by examiner

Coupling a first corner of the lid to a first pin of a first hinge, the first hinge including a first disc coupled to the first pin of the first hinge, and a second disc
*502*

Coupling a second corner of the lid to a first pin of a second hinge, the second hinge including a first disc coupled to the first pin of the second hinge, and a second disc
*504*

Coupling a first corner of the base to a second pin of the first hinge
*506*

Coupling a second corner of the base to a second pin of the second hinge
*508*

Coupling the first hinge to the second hinge by connecting one end of a first connecting rod to the second disc included in the first hinge and coupling another end of the first connecting rod to the second disc included in the second hinge
*510*

FIG. 5

HINGE FOR A MULTIPLE OPERATING MODE COMPUTING DEVICE

CROSS-REFERENCE TO RELATED APPLICATIONS

This application is a continuation of and claims priority under 35 U.S.C. § 120 to U.S. application Ser. No. 14/145,377, filed on Dec. 31, 2013, and entitled "DISC STYLE 360 DEGREE HINGE FOR A LAPTOP COMPUTER", the contents of which are hereby incorporated by reference.

TECHNICAL FIELD

This description generally relates to hinges for computing devices.

BACKGROUND

A computing device may be assembled from multiple separate parts. In addition, one or more components of the computing device may be used to attach the multiple parts of the computing device, and, in some cases, the attached parts may be moved and/or rotated with respect to one another. Example computing devices, such as laptop or notebook computers may include a lid and a base. The lid can include a display device (e.g., a touchscreen) and the base can include one or more input devices, such as a keyboard, a pointing stick, mouse buttons, a touchpad, and/or a trackpad. The lid can be attached to the base such that the lid can be moved and/or rotated with respect to the base so that the computing device can be placed into multiple positions. In order to achieve this rotation, the lid can be attached to the base using a moveable hinge that will allow the lid to be rotated about the base.

For example, in a closed position, the lid of the computing device is in contact with the top of the base of the computing device. In an open position, for example, where a user of the computing device can view and interact with both the touchscreen and the input devices included in the base, the lid may be placed in a stationary position and at approximately a 130-degree angle with respect to the base. In a full open position, for example, the user of the computing device may interact with the touchscreen display alone (e.g., using the computing device as a tablet). In this full open position, the lid of the computing device is in contact with the bottom of the base of the computing device. In order for a computing device to achieve all of these positions, rotation of the lid of the computing device nearly 360 degrees about the base of the computing device may be required.

The amount of area occupied by one or more hinges used to couple the lid of the computing device to the base of the computing device can affect the overall size (e.g., thickness) of the computing device. As computing devices become smaller and thinner, it would be beneficial if the one or more hinges used to couple the lid to the base of the computing device could also be reduced in size (e.g., diameter). In some cases, however, this may be difficult when rotation of nearly 360 degrees of the lid of the computing device with respect to the base of the computing device is required.

Thus, a need exists for systems, methods, and apparatus to address the shortfalls of present technology and to provide other new and innovative features.

SUMMARY

In one general aspect, a computing device includes a lid, and a base coupled to the lid by a hinge. The hinge includes a first disc including a first pin coupled to the lid and an inner surface, a second disc including a second pin coupled to the base and an outer surface, the first disc concentric with and partially surrounding the second disc, and a friction element disposed between the inner surface of the first disc and the outer surface of the second disc, the first disc configured to rotate about the second disc.

Example implementations may include one or more of the following features. For instance, the hinge may be configured to allow the lid to rotate about the base at different angular ranges from a first position being approximately in contact with the base to a second position being at an angle that is approximately 360 degrees with respect to the base. The hinge may be a first hinge, and the base may be coupled to the lid by the first hinge and a second hinge, the second hinge including a first disc including a first pin coupled to the lid and an inner surface, and a second disc including a second pin coupled to the base and an outer surface, the first disc concentric with and partially surrounding the second disc, the friction element being disposed between and the inner surface of the first disc of the second hinge and the outer surface of the second disc of the second hinge, and the first disc of the second hinge may be configured to rotate about the second disc of the second hinge. The first hinge may be located at a first back-end of the computing device and the second hinge may be located at a second back-end of the computing device. The computing device may further include a first connecting rod, the first connecting rod connecting the second disc of the first hinge to the second disc of the second hinge.

The computing device may further include a second connecting rod, the second connecting rod connecting the second disc of the first hinge to the second disc of the second hinge, the second connecting rod being disposed parallel to the first connecting rod. The second pin of the second disc of the first hinge may be disposed between the connection of the first connecting rod and the second connecting rod with the second disc of the first hinge. The second pin of the second disc of the second hinge may be disposed between the connection of the first connecting rod and the second connecting rod with the second disc of the second hinge. The computing device may further include a plurality of wires that are coupled between the base of the computing device to the lid of the computing device, the plurality of wires disposed between the first connecting rod and the second connecting rod.

The plurality of wires may be included in a flexible cable. The plurality of wires may connect at least one electrical component in the base of the computing device to at least one electrical component in the lid of the computing device. The at least one electrical component in the base may be a main logic board. The at least one electrical component in the lid may be one of a display, a camera sensor, a touch sensor, an ambient light sensor, or an antenna. The plurality of wires may be divided between multiple flexible cables, each of the multiple flexible cables coupled to the base of the computing device and to the lid of the computing device, and each of the multiple flexible cables disposed between the first connecting rod and the second connecting rod.

In another general aspect, a method of coupling a base to a lid of a computing device includes coupling a first corner of the lid to a first pin of a first hinge, the first hinge including a first disc coupled to the first pin of the first hinge, and a second disc, coupling a second corner of the lid to a first pin of a second hinge, the second hinge including a first disc coupled to the first pin of the second hinge, and a second disc, coupling a first corner of the base to a second pin of the first hinge, coupling a second corner of the base to a second pin of the second hinge, and coupling the first hinge to the second hinge by connecting one end of a first connecting rod to the second disc included in the first hinge and coupling another end of the first connecting rod to the second disc included in the second hinge.

Example implementations may include one or more of the following features. For instance, the method may further include coupling the first hinge to the second hinge by connecting one end of a second connecting rod to the second disc included in the first hinge and coupling another end of the second connecting rod to the second disc included in the second hinge, the second connecting rod being disposed parallel to the first connecting rod. The method may further include connecting at least one electrical component in the base of the computing device to at least one electrical component in the lid of the computing device using a plurality of wires coupled from the base of the computing device to the lid of the computing device, the plurality of wires being disposed between the first connecting rod and the second connecting rod. The plurality of wires may be included in a flexible cable.

In yet another general aspect, a hinge may include a first disc including a first pin and an inner surface, a second disc including a second pin and an outer surface, the first disc concentric with and at least partially surrounding the second disc, and a friction element disposed between the inner surface of the first disc and the outer surface of the second disc.

Example implementations may include one or more of the following features. For instance, the first disc may be configured to rotate about the second disc. The first disc may have a length equal to a length of the second disc.

The details of one or more implementations are set forth in the accompanying drawings and the description below. Other features will be apparent from the description and drawings, and from the claims.

BRIEF DESCRIPTION OF THE DRAWINGS

Like reference symbols in the various drawings indicate like elements.

DETAILED DESCRIPTION

In general, reducing the size and weight of a computing device can allow for the design of smaller, thinner, slimmer and more elegant enclosures. In addition, a user may utilize the computing device in different modes of operation. For example, a laptop or notebook computer that includes a touchscreen may be used in a standard or laptop mode. In the standard mode, a lid of the computing device can include a touchscreen and a user of the computing device can rotate the lid with respect to a base of the computing device. The user can rotate the lid to place the lid in a stationary position that is at a specific angle with respect to the base of the computing device. The user can place the base on a relatively flat stationary surface (e.g., a desktop, a lap of a user). An example of a standard mode (laptop orientation (or configuration)) is shown with respect to FIG. 2A, described in more detail below. In the standard mode, the user can interact with various inputs included in the base of the computing device while viewing the touchscreen. In addition, the touchscreen can receive input from the user.

The lid of the computing device may be rotated so that the back of the lid contacts (is substantially parallel to or is in relatively close proximity to) the bottom of the base. This allows the computing device to be used, for example, in a tablet mode (tablet orientation (or configuration)). An example of a tablet mode is shown with respect to FIG. 3A, described in more detail below.

Figure 1A:
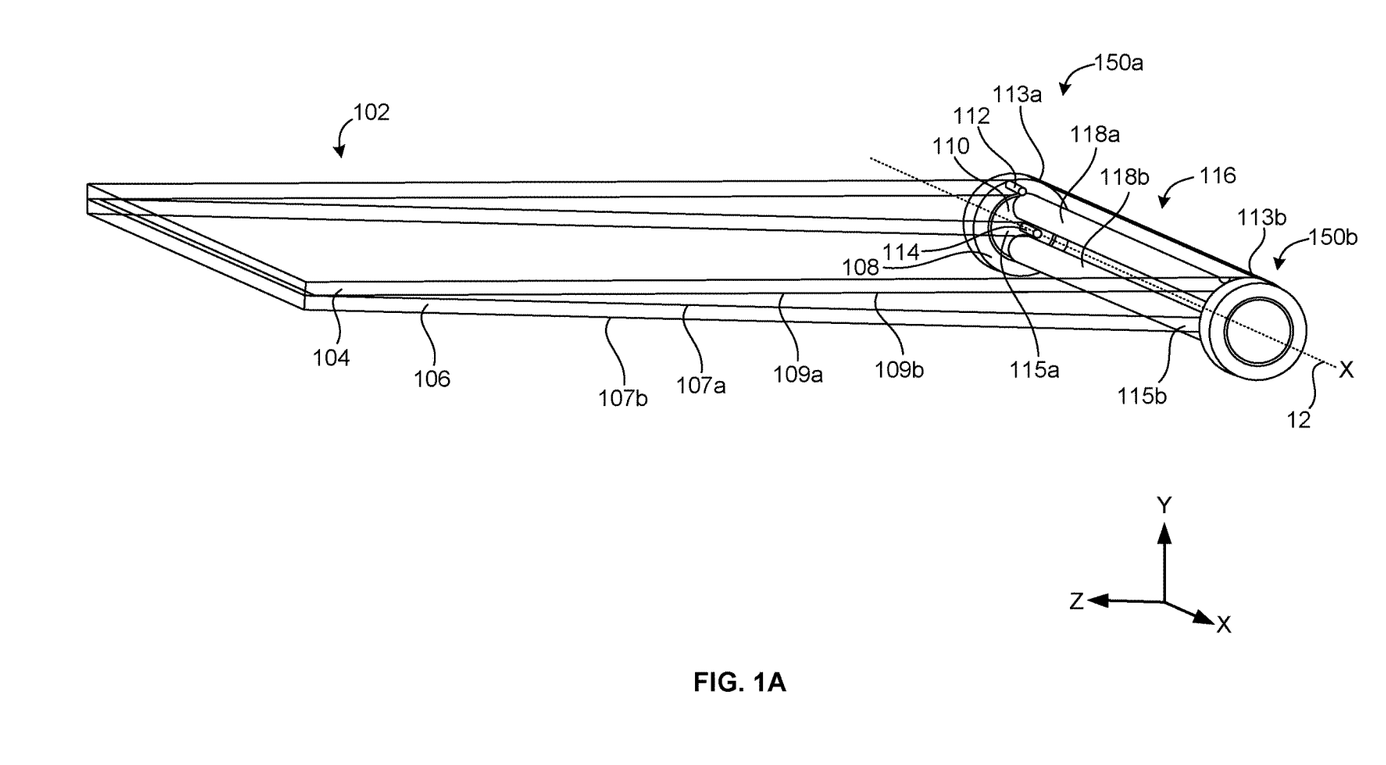
FIG. 1A is a diagram that illustrates an example computing device in a closed orientation, where the computing device includes friction disc hinges.
Figure 3A:
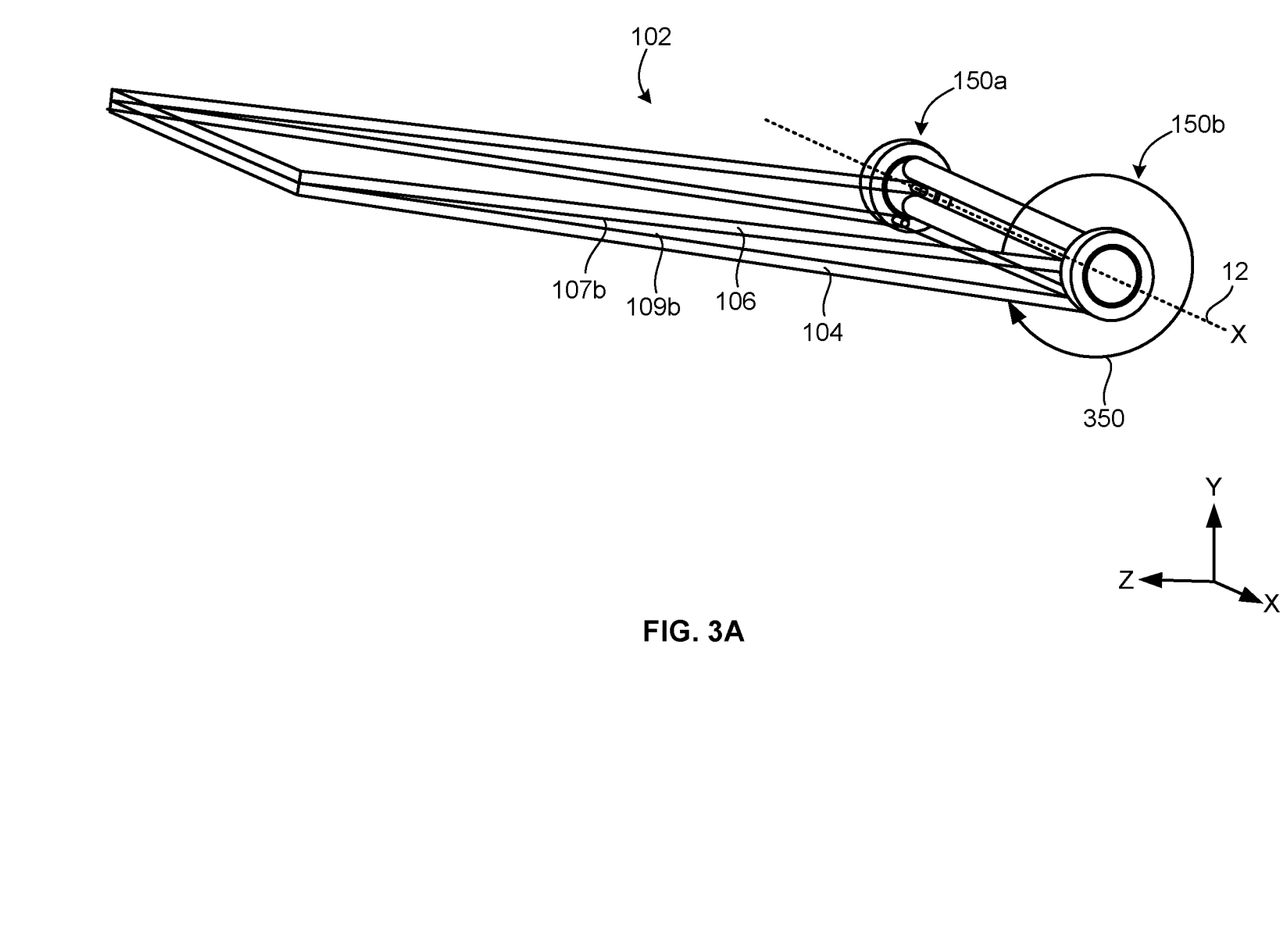
FIG. 3A is a diagram that illustrates an example computing device in a tablet orientation, where the computing device includes friction disc hinges.

In order for the computing device to be used in these multiple modes, the lid of the computing device can rotate/pivot approximately 360 degrees with respect to the base of the computing device. For example, the lid can be rotated from a closed orientation (or configuration) of the computing device, where the lid contacts an upper surface of the base to a fully opened position (tablet orientation), where the lid contacts a lower surface of the base. FIG. 1A and FIG. 3A, respectively, illustrate examples of these orientations.

In order to rotate the lid approximately 360 degrees with respect to the base, in some implementations, a standard dual pivot hinge can connect a lid to a base of a computing device. The use of a dual pivot hinge allows for 180 degrees of rotation about each pivot point. In addition, when connecting the lid to the base of the computing device, wires can be coupled between electronics included in the base of the computing device to components included in the lid of the computing device (e.g., a touchscreen display) and vice versa. The wires can be disposed (e.g., threaded or placed) along a pivot axis and may twist as the lid is rotated. As such, a pivot may include a hollow shaft for inclusion of the wires, and a diameter of the shaft is defined based on being large enough to accommodate the wires. In addition, the diameter of the pivot can be based on the inclusion of one or more friction elements, a mounting tab, and a cosmetic cover. For example, this can result in a pivot point that is approximately nine millimeters in diameter. To rotate the lid approximately 360 degrees with respect to the base, two such pivot points are needed, resulting in a computing device that is approximately 18 millimeters thick.

To reduce the thickness of the computing device while allowing the lid to be rotated approximately 360 degrees with respect to the base, a friction disc hinge can be placed on each back-end corner of a computing device, rotationally coupling the lid of the computing device to the base of the computing device. Each friction disc hinge can provide a pivot point for the rotation of the lid of the computing device with respect to the base of the computing device. Each friction disc hinge can include an outer disc that substantially surrounds an inner disc with a friction element or other type of friction-providing mechanism placed between the outer disc and the inner disc. An outer disc-connecting pin can connect the outer disc to the lid of the computing device. An inner disc-connecting pin can connect the inner disc to the base of the computing device. One or more connecting rods that are disposed along the rear of the computing device can connect the inner discs to one another providing the necessary stability to the computing device when rotation of the lid is performed. Rotating the lid of the computing device about the base of the computing device results in the rotation of the each of the outer discs about their respective inner discs. The friction between the outer discs and the inner discs can be provided so that the lid can be placed in any stable position between a closed orientation of the computing device (a zero degree position of the lid with respect to the base) and a tablet orientation of the computing device (a 360 degree position of the lid with respect to the base) while allowing the lid to be easily and smoothly rotated.

At least one flexible cable (e.g., flexible flat cables (FFCs)) can include wires that transmit signals from circuitry included in the base of the computing device (e.g., from a motherboard that includes one or more hardware microprocessors or other types of semiconductor circuitry) to one or more devices included in the lid of the computing device (e.g., an LCD display, an antenna, a camera). The at least one flexible cable can be disposed (or placed) over/between/around the one or more connecting rods. A width of the at least one flexible cable can be approximately equal to a width of the computing device. This can allow for a significant number of wires, where increasing the number of wires does not necessarily add to the overall height of the computing device as in the case of a computing device that incorporates a standard dual pivot hinge. The factor that contributes to determining the height of a computing device that uses friction disc hinges can be the diameter of the friction disc hinges. For example, a computing device that includes a 14-inch LCD display could utilize friction disc hinges that are approximately ten millimeters (mm) in diameter, resulting in a thinner computing device than a computing device that incorporates a standard dual pivot hinge. Factors that determine the diameter of a friction disc hinge can include, but are not limited to, the size and weight of the lid of the computing device, and the overall width of the computing device.

FIGS. 1A-C, 2A-B, 3A-B, and 4 are diagrams that illustrate an example computing device 102 that includes friction disc hinges 150, where reference to friction disc hinges 150 (without an alphabetical suffix) refers collectively to combination of a friction disc hinge 150a and a friction disc hinge 150b. The descriptions of a friction disc hinge included herein can be applied to each friction disc hinge included in a computing device. As such, descriptions of the form and functionality of a first friction disc hinge can be applied to a description of the form and functionality of a second friction disc hinge (and any additional friction disc hinges) and vice versa.

FIG. 1A is a diagram that illustrates an example computing device 102 in a closed orientation, where the computing device 102 includes friction disc hinges 150. In a closed orientation, a lid 104 of the computing device 102 contacts (is substantially parallel to or is in relatively close proximity to) a base 106 of the computing device 102. The lid 104 includes a front surface 109a and a back surface 109b. The base 106 includes a top surface 107a and a lower surface 107b. For example, the front surface 109a of the lid 104 can make contact with the top surface 107a of the base 106. In some implementations, the contact between the lid 104 and the base 106 can be between portions of the lid 104 and the base 106. In some implementations, the lid 104 can be parallel to the base 106. The base 106 and the lid 104 can be attached to each other using a first friction disc hinge 150a that is located at first end of a back 116 of the computing device 102 (a first back-end 117) and a second friction disc hinge 150b that is located at a second end of the back 116 of the computing device 102 (a second back-end 119).

Figure 1B:
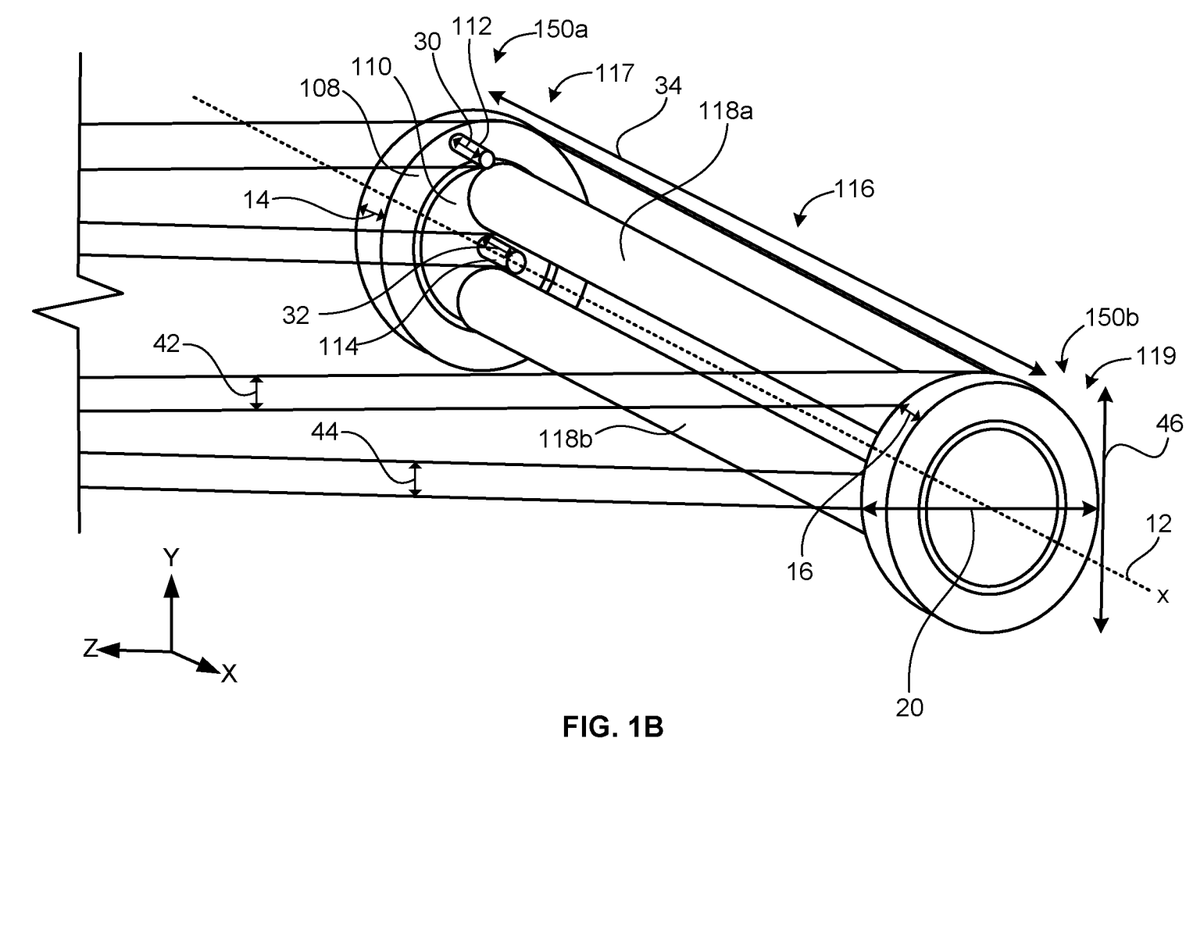
FIG. 1B is a diagram that illustrates a back of the computing device shown in FIG. 1A.
Figure 1C:
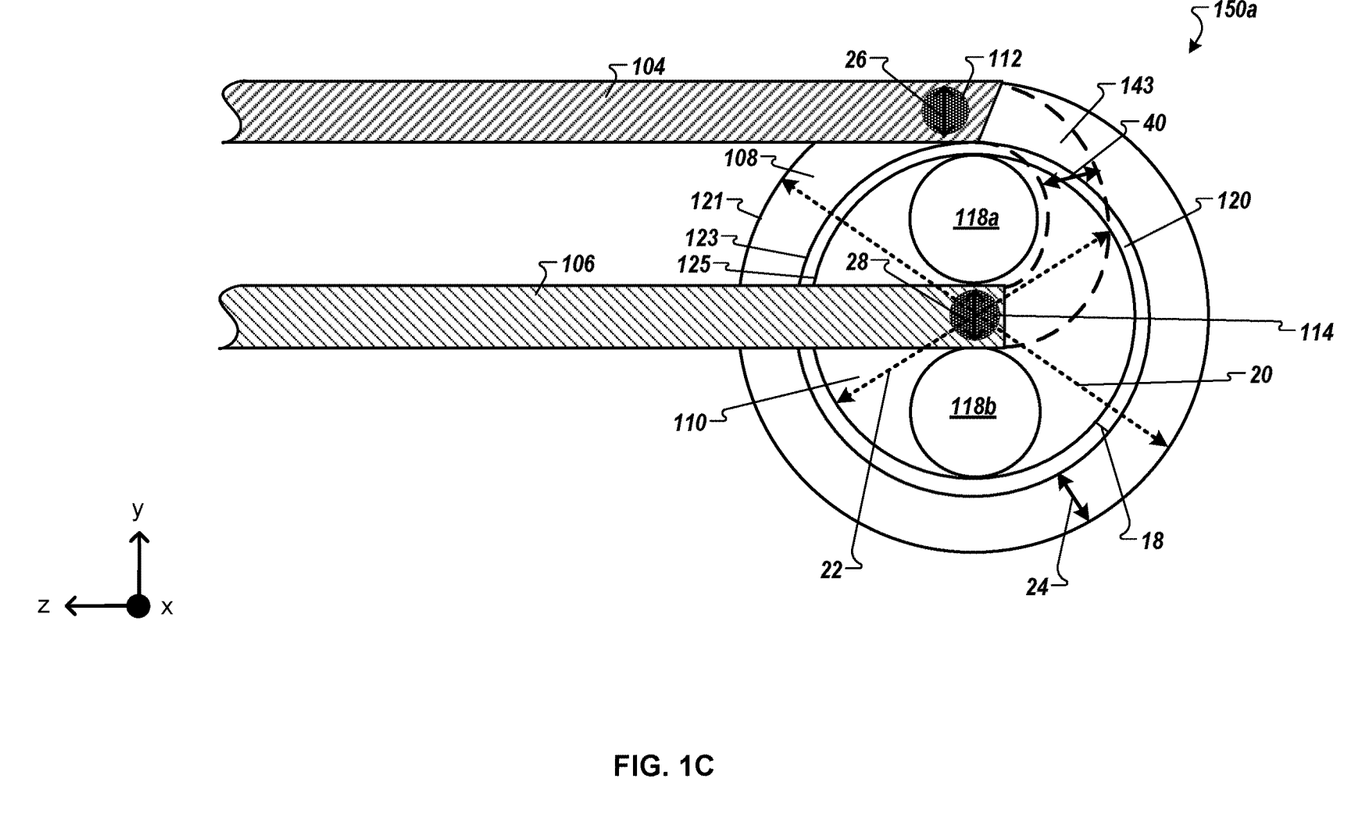
FIG. 1C is a diagram that illustrates a cross-section view of an example of a position of a friction disc hinge when a computing device is in a closed orientation, such as the example computing device as shown in FIGS. 1A-B.

FIG. 1B a diagram that illustrates the back 116 of the computing device 102 that includes friction disc hinges 150 in an enlarged view. FIG. 1C is a diagram that illustrates a cross-section view of an example of a position of the first friction disc hinge 150a when the computing device 102 is in a closed orientation. FIG. 1C is a cross-section view of the first friction disc hinge 150a. Though not shown in FIG. 1C, the position of the second friction disc hinge 150b is identical to that of the first friction disc hinge 150a. The description of the form and functionality of the first friction disc hinge 150a can be applied to a description of the form and functionality of the second friction disc hinge 150b.

Referring to FIGS. 1A-C, the first friction disc hinge 150a includes an outer disc 108 and an inner disc 110. The outer disc 108 includes an outer pin 112, an outer surface 121, and an inner surface 123. The inner disc 110 includes an inner pin 114 and an outer surface 125. Connecting rods 118a-b connect the first friction disc hinge 150a to the second friction disc hinge 150b and are disposed parallel to and along the back 116 of the computing device 102, along an x-axis 12 of the computing device 102. The connecting rods 118a-b connect to the inner disc of each of the friction disc hinges 150 on either side of the inner pin, which is located in approximately the center of the friction disc hinge. In addition, connecting rod 118a and connecting rod 118b are oriented parallel to one another and along (parallel to) the x-axis 12 of the computing device 102. FIG. 1C shows where the connecting rods 118a-b connect to the inner disc 110 of the friction disc hinge 150b.

The outer pin 112 is coupled/connected to the lid 104 at a first corner 113a. The inner pin 114 is coupled/connected to the base 106 at a first corner 115a. Though not completely shown in FIG. 1A, an outer pin of the friction disc hinge 150b is coupled/connected to the lid 104 at a second corner 113b. An inner pin of the friction disc hinge 150b is coupled/connected to the base 106 at a second corner 115b.

In some implementations, the outer disc 108 is concentric with the inner disc 110. The inner disc 110 can be disposed within an inner circumference of the outer disc 108. In the example implementation shown in FIG. 1A, the outer disc 108 surrounds the inner disc 110. In some implementations, the outer disc 108 may fully (completely) surround the inner disc 110. For example, a length of the outer disc 108 can be the same as a length of the inner disc 110. In another example, a length of the outer disc 108 can be greater than a length of the inner disc 110. In some implementations, the outer disc 108 may partially surround the inner disc 110. For example, a length of the outer disc 108 can be less than a length of the inner disc 110. The outer disc 108 can be configured to rotate about the inner disc 110. The rotation of the outer disc 108 about the inner disc 110 results in the rotation of the lid 104 about the x-axis 12 of the computing device 102, the rotation being with respect to the base 106 of the computing device 102.

A friction element 120 is located between the inner disc 110 and the outer disc 108. The friction element 120 provides friction between the inner surface 123 of the outer disc 108 and the outer surface 125 of the inner disc 110. The friction element 120 can provide sufficient friction so that the lid 104 may be placed in multiple static positions between a zero degree position (shown in FIG. 1A) and 360-degree position as (shown in FIG. 3A), the angle of the positions being with respect to the base 106 (or z-axis) of the computing device 102, where the lid 104 is parallel to (along) the y-axis of the computing device 102.

A distance 18 (distance $d_1$) (as shown in FIG. 1C) between the inner surface 123 of the outer disc 108 and the outer surface 125 of the inner disc 110 and the implementation of the friction element 120 can be defined such that the applied friction to the lid 104 can hold the lid 104 in a fixed position. In addition, the friction element 120 can be made such that the torque applied to the lid 104 by the user to rotate/move the lid 104 to the desired fixed position can be easily applied by the user.

For example, the friction element 120 can be a high viscosity type of grease applied to the outer surface 125 of the inner disc 110 (or the inner surface 123 of the outer disc 108). The distance 18 along with the viscosity of the grease can be defined so that the torque applied to the lid 104 by the user to rotate/move the lid 104 to the desired fixed position can be easily applied by the user.

In another example, the inner disc 110 can include a plurality of blades that can protrude from the outer surface 125 and make contact with/stick into the inner surface 123 of the outer disc 108. The distance 18 between the outer surface 125 of the inner disc 110 and the inner surface 123 of the outer disc 108 along with a number of the blades and their respective locations can be determined so that the torque applied to the lid 104 by the user to rotate/move the lid 104 to the desired fixed position can be easily applied by the user.

Though described as a single element, the friction element 120 can include a plurality of friction elements that provide the necessary friction to maintain the lid 104 in a static position with respect to the base 106. In some implementations, the friction element(s) can include one or more detents that provide additional friction/support for the lid 104 when placed in a position relative to the base 106. For example, a detent may be provided when the computing device 102 is configured in a laptop orientation.

In some implementations, a diameter 20 of the first friction disc hinge 150a can be the same for each friction disc hinge 150a-b (e.g., a diameter $d_2$ is the same as a diameter $d_3$, respectively). The diameter 20 can be defined based a diameter 22 (diameter $d_4$) of the inner disc 110, a width 24 (width $w_1$) of the outer disc 108, and the distance 18 (distance $d_1$) between the outer surface 125 of the inner disc 110 and the inner surface 123 of the outer disc 108. In addition, in some implementations, each of the friction disc hinges 150a-b is of a length 14, 16 (length $l_1$ and length $l_2$), respectively, which can be the same for each of the friction disc hinges 150a-b.

The outer pin 112 can have a diameter 26 (diameter $d_5$). For example, the diameter 26 is less than the width 24 of the outer disc 108. The inner pin 114 can have a diameter 28 (diameter $d_6$) and can be disposed approximately in the center of the inner disc 110. In some implementations, the diameter 26 of the outer pin 112 can be substantially the same as the diameter 28 of the inner pin 114. In some implementations, the diameter 26 of the outer pin 112 can be greater than the diameter 28 of the inner pin 114. In some implementations, the diameter 26 of the outer pin 112 can be less than the diameter 28 of the inner pin 114.

The outer pin 112 can have a length 30 (length $l_3$). The inner pin 114 can have a length 32 (length $l_4$). In some implementations, the length 30 of the outer pin 112 can be greater than the length 32 of the inner pin 114. In some implementations, the length 30 of the outer pin 112 can be less than the length 32 of the inner pin 114. In some implementations, the length of the outer pin for the first friction disc hinge 150a (length $l_3$) is the same as the length of the outer pin for the second friction disc hinge 150b (length $l_5$). In some implementations, the length of the outer pin for the first friction disc hinge 150a (length $l_3$) is different than (e.g., greater than, less than) the length of the outer pin for the second friction disc hinge 150b (length $l_5$). In some implementations, the length of the inner pin for the first friction disc hinge 150a (length $l_4$) is the same as the length of the inner pin for the second friction disc hinge 150b (length $l_6$). In some implementations, the length of the inner pin for the first friction disc hinge 150a (length $l_4$) is different than (e.g., greater than, less than) the length of the inner pin for the second friction disc hinge 150b (length $l_6$).

Factors that can define the diameter and length of each friction disc hinge 150a-b and the diameter and length of the outer pin 112 and the inner pin 114 for each friction disc hinge 150a-b can include, but are not limited to, the size of the lid 104 of the computing device 102, the weight of the lid 104 of the computing device 102, and a width 34 (width $w_2$) of the computing device 102.

For example, a laptop computing device that includes a 14 inch liquid crystal display (LCD) can include friction disc hinges 150 that are approximately between four and ten millimeters in diameter with a length between eight and 15 millimeters. In this example, a longer friction disc hinge can provide a larger "gripping" area to allow for a smaller diameter hinge.

Wires can be coupled between electronics included in the base 106 of the computing device 102 to components included in the lid 104 of the computing device 102 (e.g., a touchscreen display) and vice versa. The wires can be incorporated into at least one flexible cable 143 (e.g., a flexible flat cable (FFC)). The flexible cable 143 can provide electrical signals from circuitry included in the base 106 of the computing device 102 (e.g., from a motherboard that includes one or more hardware microprocessors or other types of semiconductor circuitry) to one or more devices included in the lid 104 of the computing device 102 (e.g., an LCD display, a touchscreen, an antenna, a camera sensor, a touch sensor, an ambient light sensor). In some implementations, all of the wires that are coupled between the lid 104 and the base 106 can be included in a single flexible cable. In some implementations, multiple flexible cables can be used to couple the wires between the lid 104 and the base 106 of the computing device 102. For example, the wires included in a flexible cable can be for related signals. For example, all of the signals for an LCD display can be included in a first flexible cable and all of the signals for an antenna can be included in a second flexible cable.

The one or more flexible cables can bend/flex around the connecting rod 118a, bending/flexing as the lid 104 is rotated about the base 106 of the computing device 102. The one or more flexible cables can be disposed along the width 34 of the computing device 102, with the exception of parts of the width 34 of the computing device 102 that are in common with the each of the friction disc hinges 150a-b.

For example, the one or more flexible cables can be disposed within a distance $d_7$ along the width of the computing device 102, where $d_7 = w_2 - ((l_1 + (\text{the greater of } l_3 \text{ or } l_4) + (l_2 + (\text{the greater of } l_5 \text{ or } l_6))$.

For example, in an implementation where the computing device 102 is a laptop computing device that includes a 14 inch liquid crystal display (LCD), the width 34 (width $w_2$) can be approximately 15 inches (381 millimeters(mm)). For example, the length 14, 16 (length $l_1$ and length $l_2$) of each of the friction disc hinges 150a-b, respectively, can be approximately ten millimeters. In addition, the longer of the lengths of the outer pin 112 and the inner pin 114 for each of the friction disc hinges 150a-b will also be taken into consideration when defining how the one or more flexible cables are disposed. In this example, the longer of the lengths of the outer pin 112 and the inner pin 114 for each friction disc hinge is approximately 10 millimeters. As such, the distance $d_7$ along the width of the computing device 102 can be calculated as: $d_7 = 381 \text{ mm} - ((10 \text{ mm} + 10 \text{ mm}) + (10 \text{ mm} + 10 \text{ mm})) = 341 \text{ mm}$.

Many factors can be used to define the number of wires in a flexible cable and the width of the flexible cable. As a non-limiting example, a flexible flat cable can have a pitch (the distance from the center of one conductor to the center of its neighboring conductor) of 1.00 mm. Each conductor is a wire that can transmit an electrical signal between the lid 104 and the base 106 of the computing device 102. In this example, one or more flexible flat cables can provide over 300 signals to/from the base 106 and the lid 104 of the computing device 102. Therefore, as the number of devices included in a computing device increases (in particular the number of devices included in the lid of a computing device (e.g., the inclusion of an antenna in the lid of the computing device) and as the resolution of these devices increases (e.g., the resolution of the display device, the resolution of the camera device, etc.), more and more signals need to be provided by electronics included in the base of the computing device to the devices included in the lid of the computing device. In another non-limiting example, a flexible flat cable can have a pitch (the distance from the center of one conductor to the center of its neighboring conductor) of 0.50 mm allowing over 600 signals to be coupled between the base 106 and the lid 104 of the computing device 102. In another non-limiting example, multiple flexible flat cables can be used to coupled signals from the base 106 to the lid 104 of the computing device 102, where each flexible flat cable can be of a different pitch (e.g., some cables can have a 1.00 mm pitch, some cables can have a 0.50 mm pitch).

In some implementations, a thickness 40 (thickness $t_3$) of the flexible cable 143 can be approximately the same as a thickness 42 (thickness $t_1$) of the lid 104 of the computing device 102. In some implementations, the thickness 40 of the flexible cable 143 can be approximately the same as a thickness 44 (thickness $t_2$) of the base 106 of the computing device 102. In some implementations, the thickness 40 of the flexible cable 143 can be different than (e.g., less than or greater than) the lid thickness 42. In some implementations, the thickness 40 of the flexible cable 143 can be different than (e.g., less than or greater than) the base thickness 44. For example, the thickness 40 can be based on the pitch of the wires included in the flexible cable 143.

The flexible cable 143 can be encased/covered and/or disposed within a flexible protective housing made of, for example, rubber, flexible fabric, or some other type of flexible protective material. The flexible cable 143 and its housing can account for the thickness 40 of the flexible cable 143.

In some implementations, a height 46 (height h) of the computing device 102 may be defined based on the size (diameter) of the friction disc hinges 150. In some implementations, though not shown in FIG. 1A-C, the height 46 of the computing device 102 may be defined based on the lid thickness 42 and the base thickness 44. In these implementations, the size (diameter) of the friction disc hinges 150 would be less than that of the combined thicknesses of the lid 104 and the base 106 (the combined thickness 42 and thickness 44).

In some implementations, the base thickness 44 is different than (e.g., greater than, less than) the lid thickness 42. In some implementations, the base thickness 44 can be similar to (identical to) the lid thickness 42.

The base 106 can be made of a rigid material, such as plastic or metal. The base 106 can include components of the computing device 102. The components can include, but are not limited to, a main logic board (MLB), a central processing unit (CPU), memory, a battery, and one or more input devices, such as a keyboard, a pointing stick, mouse buttons, a touchpad, and/or a trackpad. The base 106 can include an top surface 107a and a lower surface 107b. The components of the computing device 102 can be positioned in (e.g., disposed within) an area between the top surface 107a and the lower surface 107b.

The lid 104 can also be made of a rigid (e.g., relatively rigid) material, such as plastic or metal. The lid 104 can include a display area that can provide visual output to the user. The lid 104 can include additional components of the computing device 102. The components can include, but are not limited to, a liquid crystal display (LCD), a plasma display, or a light-emitting diode (LED) display. The display area can also receive input from a user, for example as in a case where the display area includes a touchscreen device. The lid 104 may also include a camera sensor, a touch sensor, an ambient light sensor and/or an antenna.

Figure 2A:
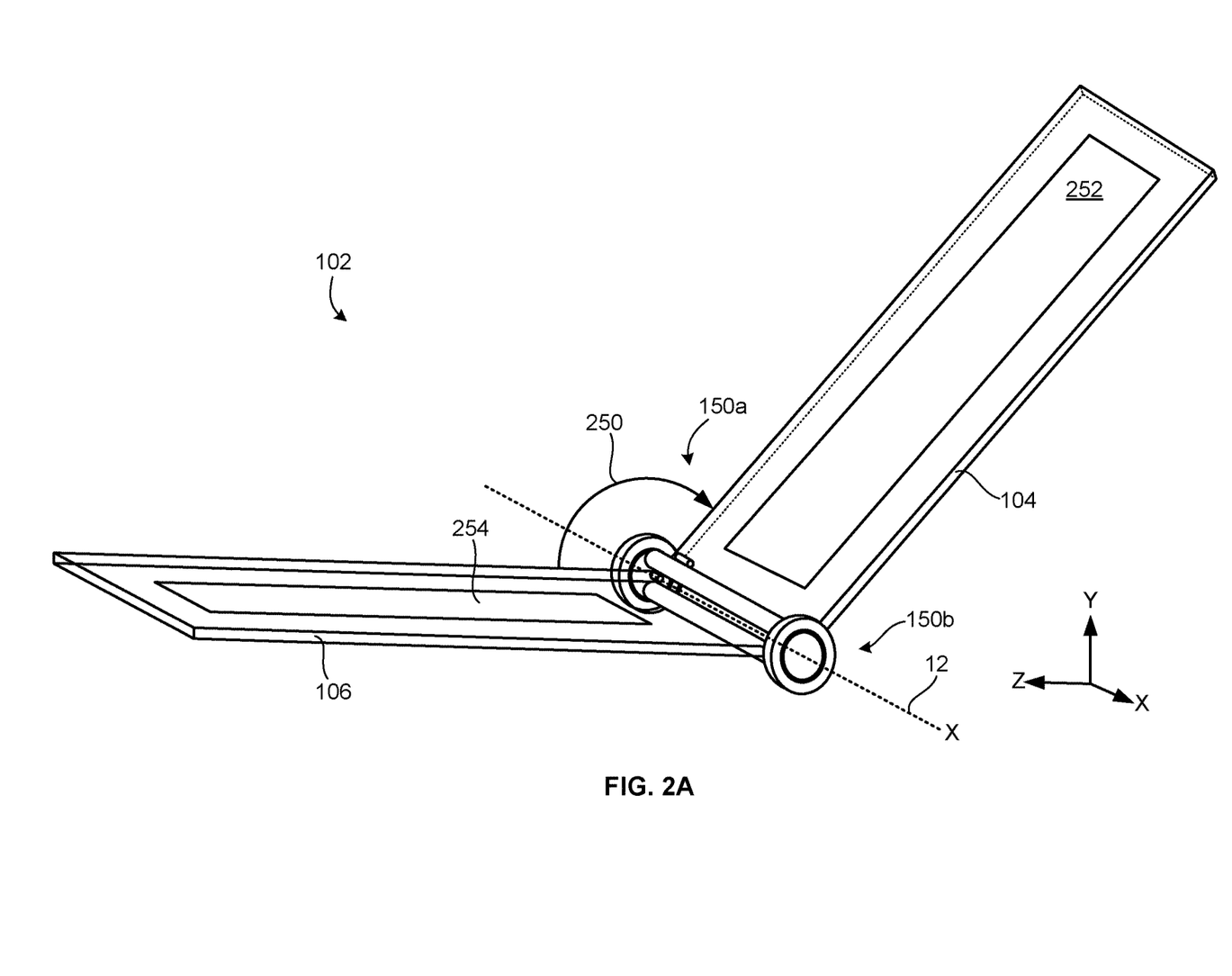
FIG. 2A is a diagram that illustrates an example computing device in a laptop orientation, where the computing device includes friction disc hinges.

FIG. 2A is a diagram that illustrates the example computing device 102 in a laptop orientation. In the laptop orientation, the lid 104 of the computing device is at an angle 250 with respect to the base 106. The lid 104 can include a display device 252 (e.g., a touchscreen) that allows a user of the computing device to interact with various inputs 254 included in the base 106 of the computing device 102 while viewing the touchscreen. In addition, the touchscreen can receive input from the user.

Figure 2B:
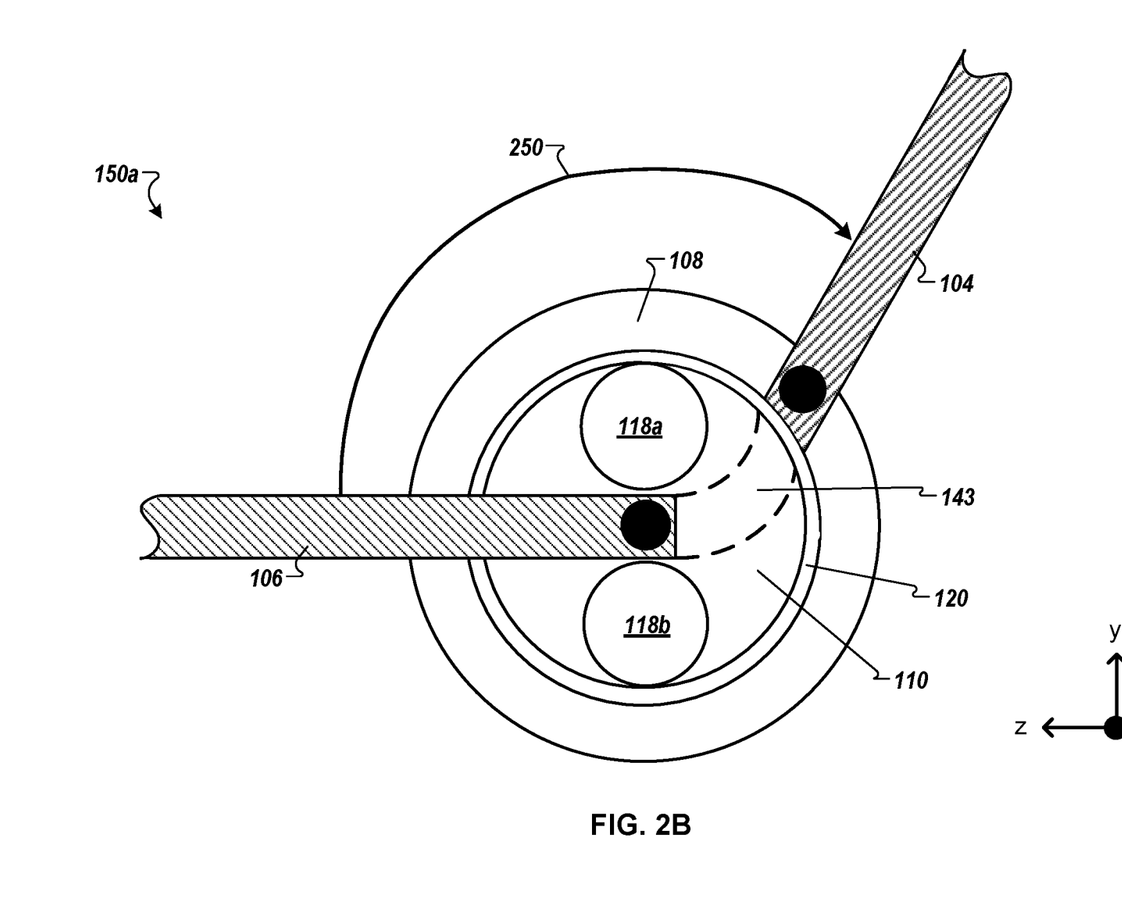
FIG. 2B is a diagram that illustrates a cross-section view of an example of a position of a friction disc hinge when a computing device is in a laptop orientation, such as the example computing device as shown in FIG. 2A.

FIG. 2B is a cross-section view of the first friction disc hinge 150a when the computing device 102 is in a laptop orientation. Though not shown in FIG. 2B, the position of the second friction disc hinge 150b is identical to that of the first friction disc hinge 150a. The description of the form and functionality of the first friction disc hinge 150a can be applied to a description of the form and functionality of the second friction disc hinge 150b.

Referring to FIGS. 2A-B, the friction element 120 can provide sufficient friction so that the lid 104 may be placed in the static position at the angle 250 with respect to the base 106 (or z-axis) of the computing device 102, where the lid 104 is parallel to (along) the y-axis of the computing device 102. The friction element 120 can also be implemented so that torque applied to the lid 104 by the user to rotate/move the lid 104 to the desired fixed position can be easily applied by the user. Use of the friction disc hinge 150 enables the lid 104 to rotate about the base 106 as the outer disc 108 is rotated about the inner disc 110. The rotation of the outer disc 108 about the inner disc 110 results in the rotation of the lid 104 about the x-axis 12 of the computing device 102, the rotation being with respect to the base 106 (or z-axis) of the computing device 102.

The rotational motion is constrained sufficiently by the friction element 120 to prevent the lid 104 from slipping away from the base 106 while allowing the lid 104 to remain in a static position once the rotational motion is stopped. The connecting rods 118a-b stabilize the computing device 102 so that the torque applied to the lid 104 by the user to rotate/move the lid 104 to the desired fixed position does not result in the computing device 102 bending or flexing.

The lid 104 can be placed at the angle 250 with respect to the base 106, where the angle 250 is approximately a 135 degree angle (i.e., 135 degrees±35 degrees). In this laptop position, for example, the user can interact with one or more input devices included in the base 106 while viewing a display included in the lid 104. In some cases, the placement of the lid 104 in this position can be a factor of the type of computing device. For example, a user using a laptop computer may place the lid 104 at greater than the 135 degree angle with respect to the base 106, while a user of a notebook or other computing device that is smaller than the laptop computer may place the lid 104 at an angle less than the 135 degree angle with respect to the base 106.

FIG. 2B shows the flexible cable 143 in a state that is different from state of the flexible cable 143 as shown in FIG. 1C, illustrating how the flexible cable 143 bends/flexes as the outer disc 108 is rotated about the inner disc 110 from the first position shown in FIG. 1C to the second position shown in FIG. 2B.

FIG. 3A is a diagram that illustrates the example computing device 102 in a tablet orientation. In the tablet orientation, the lid 104 of the computing device is at an angle 350 with respect to the base 106. In the tablet orientation, in some implementations, the back surface 109b of the lid 104 can make contact with the lower surface 107b of the base 106. In some implementations, the contact between the lid 104 and the base 106 can be between portions of the lid 104 and the base 106. In some implementations, the lid 104 can be parallel to the base 106.

Figure 3B:
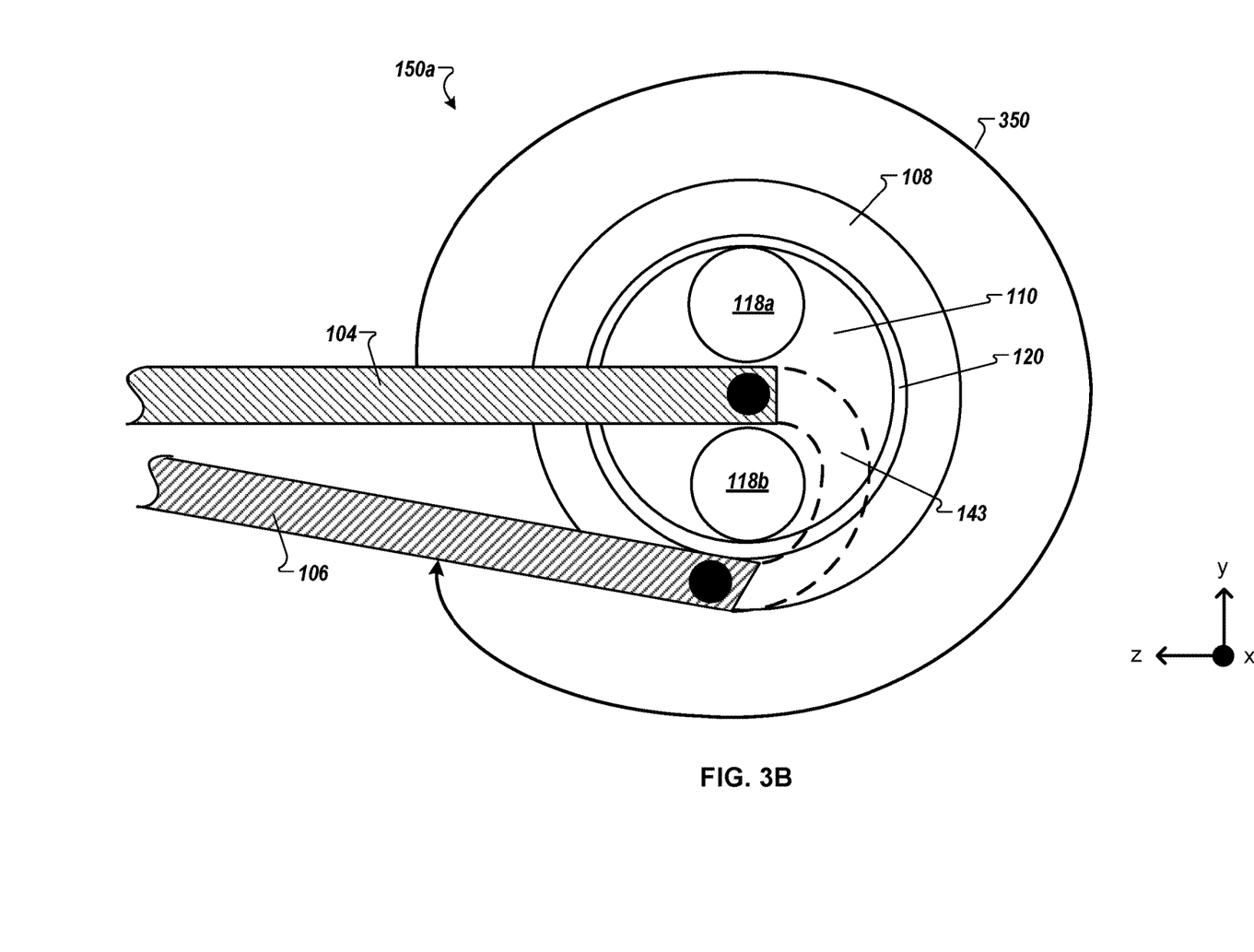
FIG. 3B is a diagram that illustrates a cross-section view of an example of a position of a friction disc hinge when a computing device is in a laptop orientation, such as the example computing device as shown in FIG. 3A.

FIG. 3B is a cross-section view of the first friction disc hinge 150a when the computing device 102 is in a tablet orientation. Though not shown in FIG. 3B, the position of the second friction disc hinge 150b is identical to that of the first friction disc hinge 150a. The description of the form and functionality of the first friction disc hinge 150a can be applied to a description of the form and functionality of the second friction disc hinge 150b.

Referring to FIGS. 3A-B, the friction element 120 can provide sufficient friction so that the lid 104 may be placed in the static position at the angle 350 with respect to the base 106 (or z-axis) of the computing device 102, where the lid 104 is parallel to (along) the y-axis of the computing device 102. The friction element 120 can also be implemented so that torque applied to the lid 104 by the user to rotate/move the lid 104 to the desired fixed position can be easily applied by the user. Use of the friction disc hinge 150 enables the lid 104 to rotate about the base 106 as the outer disc 108 is rotated about the inner disc 110. The rotation of the outer disc 108 about the inner disc 110 results in the rotation of the lid 104 about the x-axis 12 of the computing device 102, the rotation being with respect to the base 106 (or z-axis) of the computing device 102.

The rotational motion is constrained sufficiently by the friction element 120 to prevent the lid 104 from slipping away from the base 106 while allowing the lid 104 to remain in a static position once the rotational motion is stopped. The connecting rods 118a-b stabilize the computing device 102 so that the torque applied to the lid 104 by the user to rotate/move the lid 104 to the desired fixed position does not result in the computing device 102 bending or flexing.

The lid 104 can be placed at the angle 350 with respect to the base 106, where the angle 350 is approximately a 360 degree angle (i.e., 360 degrees±25 degrees). In this tablet position, for example, the user can interact with a touchscreen included in the lid 104, using the computing device 102 as a tablet.

FIG. 3B shows the flexible cable 143 in a state that is different from state of the flexible cable 143 as shown in FIG. 1C, and that is different from state of the flexible cable 143 as shown in FIG. 2C, illustrating how the flexible cable 143 bends/flexes as the outer disc 108 is rotated about the inner disc 110 from a first position shown in FIG. 1C to a second position shown in FIG. 2B, and then to a third position as shown in FIG. 3B. For example, FIG. 1C shows the flexible cable 143 in a first state when the computing device 102 is in a closed configuration. In the first state, the flexible cable 143 is wrapped around the first connecting rod 118a. For example, FIG. 3B shows the flexible cable 143 in second state when the computing device 102 is in a tablet configuration. In the second state, the flexible cable 143 is wrapped around the second connecting rod 118b.

As the examples shown in FIGS. 1A-C, 2A-B, 3A-B, and 4A-B illustrate, the lid 104 of the computing device 102 can include a display area that can provide visual output to the user. For example, the display area can include a liquid crystal display (LCD), a plasma display, or a light-emitting diode (LED) display. The display area can also receive input from a user, for example as in a case where the display area includes a touchscreen device. The lid may also include a camera sensor, a touch sensor, or an ambient light sensor.

The base 106 can include one or more input devices such as a keyboard, a pointing stick, mouse buttons, a touchpad, and/or a trackpad. The multiple positions of the computing device 102 allow a user to change the viewing angle of the display area relative to the base 106 while the base 106 remains stationary. The user can place the computing device 102 into a configuration that allows the user to interact in a preferred way with the computing device 102.

In addition or in the alternative, the lid 104 of the computing device 102 can be rotated about the base 106 of the computing device 102 and placed in a 180-degree position, where the lid 104 is placed at approximately a 180 degree angle (i.e, 180 degrees±20 degrees) with respect to the base 106, which remains stationary. In addition or in the alternative, the lid 104 of the computing device 102 can be rotated about the base 106 of the computing device 102 and placed in a 270-degree position, where the lid 104 is placed at approximately a 270 degree angle (i.e., 270 degrees±45 degrees) with respect to the base 106, which remains stationary.

Figure 4:
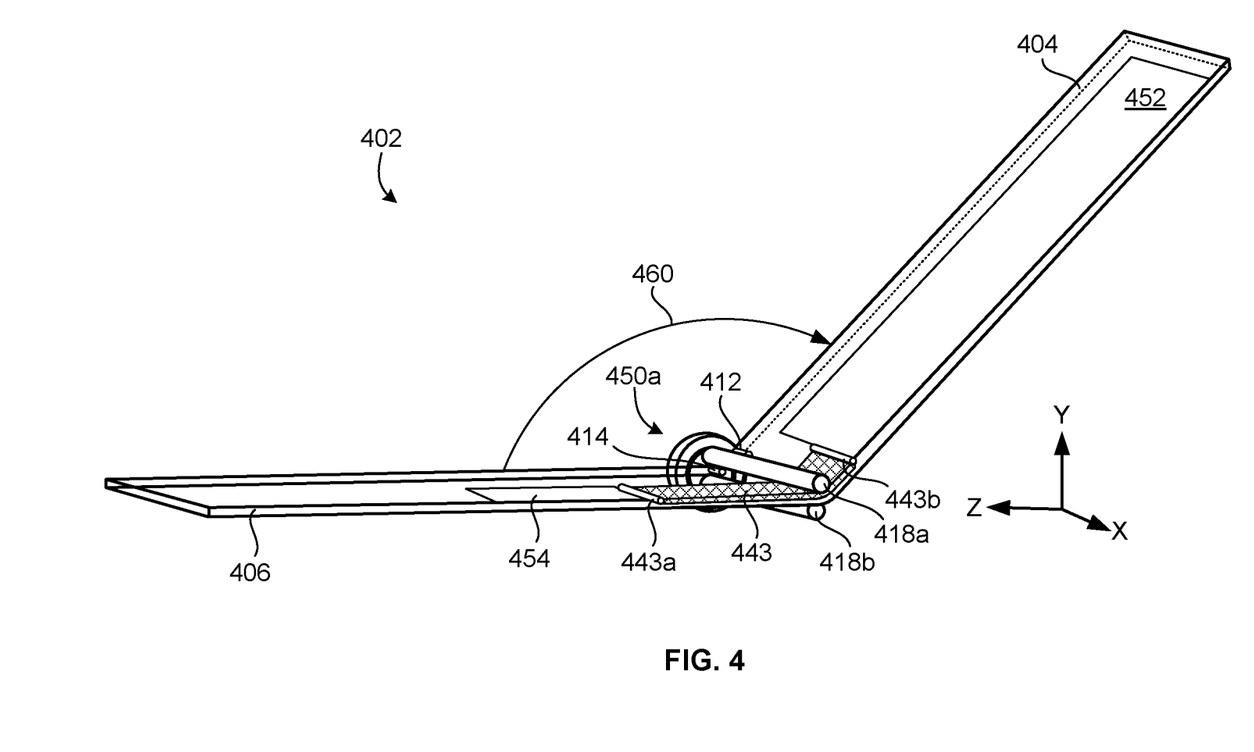
FIG. 4 is a diagram that illustrates an example computing device in a laptop position that shows a flexible cable coupled from a base of the computing device to a lid of the computing device.

FIG. 4 is a diagram that illustrates a cross-section of an example computing device 402 in a laptop orientation that shows a cross-section of a flexible cable 443 coupled from a base 406 of the computing device to a lid 404 of the computing device 402. For example, the computing device 402 can be the computing device 102 as shown in FIGS. 1A-C, 2AB, and 3A-B.

The computing device 402 is shown in a laptop orientation, where the lid 404 is placed at an angle 460 with respect to the base 406. An example of a computing device in a laptop orientation was shown and described with respect to FIGS. 2A-B. In the laptop orientation, a user of the computing device 402 can interact with various inputs included in the base 406 of the computing device 102 while viewing and/or interacting with a display device (e.g., a touchscreen) included in the lid 404 of the computing device 402.

Though not shown in FIG. 4, the position of a second friction disc hinge is identical to that of a first friction disc hinge 450a. The description of the form and functionality of the first friction disc hinge 450a can be applied to a description of the form and functionality of the second friction disc hinge.

The flexible cable 443 can include a plurality of wires that transmit a plurality of signals from circuitry 454 included in the base 406 of the computing device 402 to components 452 included in the lid 404 of the computing device 402 and vice versa. For example, the circuitry 454 can be a motherboard that includes one or more hardware microprocessors or other types of semiconductor circuitry. For example, the components 452 can include, but are not limited to, one or more of an LCD display, a plasma display, a light-emitting diode (LED) display, a touchscreen, an antenna, a camera sensor, a touch sensor, or an ambient light sensor.

A first end 443a of the flexible cable 443 is connected/coupled to the circuitry 454 and a second end 443b of the flexible cable 443 is connected/coupled to one or more of the components 452. The flexible cable 443 is coupled/disposed between connecting rods 418a-b. As described with reference to FIGS. 1A-C, the flexible cable 443 is disposed beyond an inner pin 414 and an outer pin 412 (and is disposed beyond an inner pin and an outer pin of a second friction disc hinge). A thickness of the flexible cable 443 (e.g., thickness 40 of the flexible cable 143) is defined such that the flexible cable 443 can be coupled/disposed between connecting rods 418a-b, the flexible cable 443 flexing/bending as the lid 404 is rotated about the base 406 of the computing device 402 without interfering with the rotation of the lid 404.

A width (width $w_3$) of the flexible cable 443 can be the available width of the computing device 402. Referring to FIG. 1A, the available width can be the distance $d_7$ where $d_7 = w_2 - ((l_1 + (\text{the greater of } l_3 \text{ or } l_4) + (l_2 + (\text{the greater of } l_3 \text{ or } l_6))$. One or more flexible cables, such as the flexible cable 443, can be disposed within the available width from the base 406 of the computing device 402 to the lid 404 of the computing device 402.

In some implementations, a computing device may include a single friction disc hinge (e.g., the friction disc hinge 150a as shown in FIGS. 1A-C, 2A-B, and 3A-B). For example, the friction disc hinge can connect/couple a lid of the computing device to a base of the computing device. A length and a diameter of the friction disc hinge could be defined so that torque applied to the lid to rotate/move the lid to a desired fixed position can be easily applied by the user while providing the necessary support and stability for the lid to be placed and maintained in a fixed static position.

Figure 5:
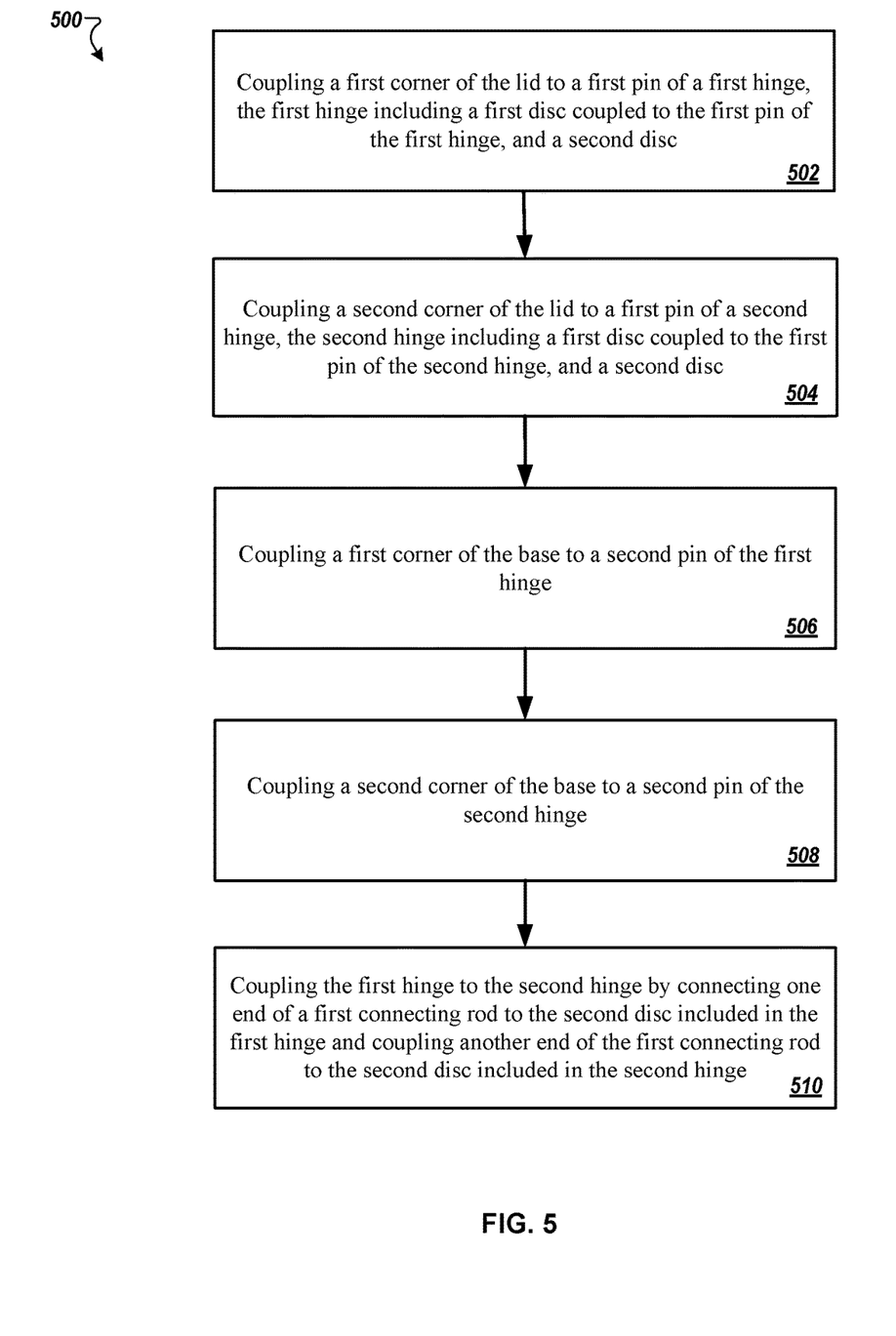
FIG. 5 is a flowchart that illustrates an example method for coupling a base to a lid of a computing device.

FIG. 5 is a flowchart that illustrates an example method 500 for coupling a base to a lid of a computing device. According to this example, the method 500 includes coupling a first corner of the lid to a first pin of a first hinge, the first hinge including a first disc coupled to the first pin of the first hinge, and a second disc (502). The method 500 also includes coupling a second corner of the lid to a first pin of a second hinge, the second hinge including a first disc coupled to the first pin of the second hinge, and a second disc (504). The method further includes coupling a first corner of the base to a second pin of the first hinge (506), coupling a second corner of the base to a second pin of the second hinge (508), and coupling the first hinge to the second hinge by connecting one end of a first connecting rod to the second disc included in the first hinge and coupling another end of the first connecting rod to the second disc included in the second hinge (510).

Though the implementations herein are described with respect to a user rotating a lid of a computing device from a closed position (closed position) to a 360-degree position, they can also be applied to a user rotating a lid from the 360-degree position to the closed position.

A number of embodiments have been described. Nevertheless, it will be understood that various modifications may be made without departing from the spirit and scope of the disclosure.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:
1. A computing device comprising:
a base including a top surface;
a lid including a front surface; and
a hinge located at a back of the computing device,
the lid coupled to the base by the hinge, the coupling connecting the lid to the base at the back of the computing device,
the hinge being configured to allow movement of the lid from a closed orientation of the computing device to a laptop orientation of the computing device, and
the lid being in partial contact with the base when the computing device is in the closed orientation, the partial contact being between the front surface of the lid included in a portion of the lid located at a front of the computing device and the top surface of the base included in a portion of the base located at the front of the computing device.

2. The computing device of claim 1, wherein movement of the lid from a closed orientation of the computing device to a laptop orientation of the computing device includes placing the lid in a stationary position with respect to the base.

3. The computing device of claim 2, wherein the hinge is further configured to allow the lid to be placed in multiple stationary positions with respect to the base, the multiple stationary positions being between the closed orientation and the laptop orientation.

4. The computing device of claim 3, wherein placing the lid in a stationary position with respect to the base includes placing the lid at a specific angle with respect to the base.

5. The computing device of claim 1,
wherein the computing device includes a first height and a second height when the computing device is in the closed orientation,
wherein the first height of the computing device is based on a size of the hinge, and
wherein the second height of the computing device is based on a sum of a thickness of the lid and a thickness of the base.

6. The computing device of claim 5, wherein the first height and the second height are in a direction parallel to a y-axis of the computing device.

7. The computing device of claim 6,
wherein the first height of the computing device is measured at the back of the computing device, and
wherein a second height of the computing device is measured at the front of the computing device.

8. The computing device of claim 7, wherein the first height is greater than the second height.

9. The computing device of claim 8,
wherein the front of the computing device is opposite to the back of the computing device.

10. The computing device of claim 5, wherein the size of the hinge is based on one or more of a size of the lid, a weight of the lid, and a width of the computing device.

11. The computing device of claim 1, wherein the lid being in partial contact with the base when the computing device is in the closed orientation includes a space being formed between the lid and the base at the back of the computing device.

12. The computing device of claim 11, wherein the closed orientation of the computing device includes the lid and the base being orientated in a non-parallel configuration, the lid forming a V shape with respect to the base.

13. A computing device comprising:
a back;
a base including one or more input devices;
a lid including a touchscreen; and
a hinge located at the back of the computing device,
the lid coupled to the base by the hinge,
the coupling connecting the lid to the base at the back of the computing device,
the hinge being configured to allow the lid to be placed in multiple stationary positions with respect to the base,
the multiple stationary positions being between a closed orientation of the computing device and a laptop orientation of the computing device,
the closed orientation placing the lid in partial contact with the base, and
the laptop orientation placing the lid at a specific angle with respect to the base, the specific angle based on allowing user interaction with the one or more input devices and the touchscreen.

14. The computing device of claim 13, wherein the closed orientation placing the lid in partial contact with the base includes a space being formed between the lid and the base at the back of the computing device.

15. The computing device of claim 14, wherein the closed orientation the closed orientation placing the lid in partial contact with the base includes the lid and the base being orientated in a non-parallel configuration, the lid forming a V shape with respect to the base.

16. The computing device of claim 13, further including a front opposite the back, wherein the closed orientation placing the lid in partial contact with the base includes the partial contact being between a portion of the lid located at the front of the computing device and a portion of the base located at the front of the computing device.

17. The computing device of claim 16,
wherein the computing device includes a first height and a second height when the computing device is in the closed orientation,
wherein the first height of the computing device is based on a size of the hinge at the back of the computing device, and
wherein the second height of the computing device is based on a sum of a thickness of the lid and a thickness of the base at a point of the partial contact between the lid and the base at the front of the computing device.

18. The computing device of claim 17, wherein the first height is greater than the second height.

19. The computing device of claim 13, wherein a size of the hinge is based on a size of the lid, a weight of the lid, and a width of the computing device.

20. A method for opening a computing device including a base, a lid, and a hinge, the method comprising:
coupling the lid to the base using the hinge; and
moving the lid from a first position that places the computing device in a closed orientation to a second position that places the computing device in a laptop orientation, the closed orientation placing the lid in partial contact with the base; and the moving including:
placing the lid in a stationary position with respect to the base at the second position, the stationary position placing the lid at an angle with respect to the base, the angle based on allowing user interaction with one or more input devices included in the base.

* * * * *

UNITED STATES PATENT AND TRADEMARK OFFICE
CERTIFICATE OF CORRECTION

PATENT NO. : 10,013,021 B2  
APPLICATION NO. : 15/163836  
DATED : July 3, 2018  
INVENTOR(S) : Matsuoka Page 1 of 1

It is certified that error appears in the above-identified patent and that said Letters Patent is hereby corrected as shown below:

On the Title Page

Item (74), Column 2, in "Attorney, Agent, or Firm", Line 1, delete "Bellerman" and insert -- Bellermann --, therefor.

In the Claims

In Column 14, Line 38, Claim 1, delete "device" and insert -- device, --, therefor.

In Column 15, Line 35, Claim 13, delete "device" and insert -- device, --, therefor.

In Column 16, Lines 9-10, Claim 15, delete "the closed orientation the closed orientation" and insert -- the closed orientation --, therefor.

Signed and Sealed this  
Nineteenth Day of February, 2019

Andrei Iancu  
*Director of the United States Patent and Trademark Office*